United States Patent [19]

Constantinescu

[11] Patent Number: 4,518,876

[45] Date of Patent: May 21, 1985

[54] TTL-ECL INPUT TRANSLATION WITH AND/NAND FUNCTION

[75] Inventor: Ion Constantinescu, Palo Alto, Calif.

[73] Assignee: Advanced Micro Devices, Inc., Sunnyvale, Calif.

[21] Appl. No.: 480,994

[22] Filed: Mar. 30, 1983

[51] Int. Cl.³ .............. H03K 19/092; H03K 19/086; H03F 3/45
[52] U.S. Cl. .............. 307/475; 307/455; 307/356; 330/257; 323/316
[58] Field of Search .............. 307/443, 445, 454-456, 307/467, 475, 355, 356, 358, 360, 264, 270; 330/288, 257; 323/315, 316

[56] References Cited

U.S. PATENT DOCUMENTS

| | | | |
|---|---|---|---|
| 3,539,824 | 11/1970 | Yu et al. | 307/455 |
| 3,686,512 | 8/1972 | Kroos | 307/455 |
| 3,787,737 | 1/1974 | Mukai | 307/454 |
| 3,959,666 | 5/1976 | Fett et al. | 307/475 |
| 3,974,402 | 8/1976 | Fett et al. | 307/475 |
| 4,145,621 | 3/1979 | Colaco | 307/454 |
| 4,334,196 | 6/1982 | Schade, Jr. | 330/257 X |

Primary Examiner—Stanley D. Miller
Assistant Examiner—David R. Bertelson
Attorney, Agent, or Firm—Patrick T. King; Gary T. Aka

[57] ABSTRACT

A new and improved translation circuit that accepts TTL signals and converts them to ECL levels while performing an AND/NAND function is provided, comprising at least two emitter-coupled transistor pairs, each coupled to an input terminal for receiving corresponding TTL signals and coupled to one another for performing the AND operation. Each emitter-coupled pair is also coupled to a bias drive for providing reference voltages that designate which one of each of the transistor pairs conducts, depending upon the state of the TTL signal received.

17 Claims, 3 Drawing Figures

TTL-ECL INPUT TRANSLATION WITH AND/NAND FUNCTION

BACKGROUND OF THE INVENTION

This invention relates generally to digital circuits, and more particularly to a new and improved translation circuit for converting transistor-transistor-logic (TTL) signals to voltage levels that are compatible with emitter-coupled-logic (ECL) circuitry.

The explosive growth experienced in various of the electronic industries today has resulted in part from the ability to integrate more and more electronic circuitry on smaller and smaller areas of silicon. This integration stems not only from the unique techniques developed in recent years to fabricate electronic integrated circuits, but also from more efficient circuit design which also reduces component count. In addition to reducing the area needed to form a circuit on a chip, reducing component count through efficient circuit design often also results in improved operating speeds and lower power consumption.

Further, while recently developed semiconductor fabrication techniques and processes have achieved astounding success in raising the number of circuit components that can be formed on a given area of silicon, there are limits. Accordingly, when present fabrication techniques reach a limit as to the component count that can feasibly be formed on an integrated circuit chip of a certain size, efficient design techniques become important in the ever-present effort to put more and more circuits on the chip.

Turning to another aspect of digital systems that utilize bipolar technology, it is sometimes necessary to combine and use transistor-transistor-logic (TTL) with emitter-coupled-logic (ECL) on a single system. Alternatively, one digital system may be implemented in TTL, while another in ECL, and a need arises to connect the two together. Typically, TTL circuitry operates with higher voltage swings than that used in ECL in order to saturate or turn off various transistor elements. ECL uses transistors in the non-saturating mode to attain the high operating speeds for which it is known. That is, ECL configured transistors do not switch full-on or full-off, but swing above and below one or more given reference voltages.

In any event, whether TTL and ECL circuits are mixed or a TTL system must communicate with an ECL system, digital signals produced by TTL circuitry must be converted to ECL levels before they can be used by ECL circuitry. Often, this is accomplished by using a separate level shifting circuit at each input of the ECL circuit that receives a TTL signal.

SUMMARY OF THE INVENTION

The present invention presents an efficient circuit design to minimize circuitry in order to reduce the necessary silicon area needed for producing the circuit, in addition to providing a combination TTL to ECL translation circuit that includes the logical AND/NAND functions. According to the present invention, therefore, there is provided a number of emitter-coupled pairs, one for each TTL signal to be converted, each of the emitter-coupled pairs being coupled to an input terminal for receiving a TTL signal, to a bias driver for receiving a reference voltage, to a single current source, and to one another for performing simultaneously both the TTL to ECL voltage level translation and the AND/NAND function.

A number of advantages are achieved by the present invention. By implementing both the translation and AND/NAND functions in a single circuit configuration component count, delay time (i.e., propagation time through the components from input to output of the circuit), and power consumption are all reduced. Concomitant with these reductions are, of course, the reduction of the space needed on the chip to form the circuit.

These and other advantages of the present invention will become more apparent to those skilled in this art upon a reading of the following detailed description of the invention, which should be taken in conjunction with the accompanying drawings.

DETAILED DESCRIPTION

Figure 1:
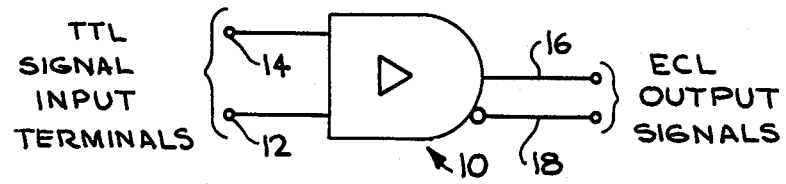
FIG. 1 is a diagrammatic representation of the functions implemented by the present invention.

Illustrated in FIG. 1 is a representation of the functions performed by the translation circuit (designated generally with the reference numeral 10) of the present invention. As shown, the translation circuit 10 receives, at input terminals 12 and 14, TTL signals which typically will be one of two logic states each represented by a particular voltage level: In positive logic, a "LOW" or logic "ZERO" state is represented by a voltage in the range of 0–0.8 VDC, and a "HIGH" or logic "ONE" state is represented by a voltage in the range of 2.4–4.5 VDC. The TTL signals received at the input terminals 12 and 14 are converted to voltage levels that are compatible with standard ECL circuitry, appearing at the output lines 16 and 18 of the translation circuit 10 as ECL signals that respectively represent the AND or the NAND of the received TTL input signals.

Figure 2:
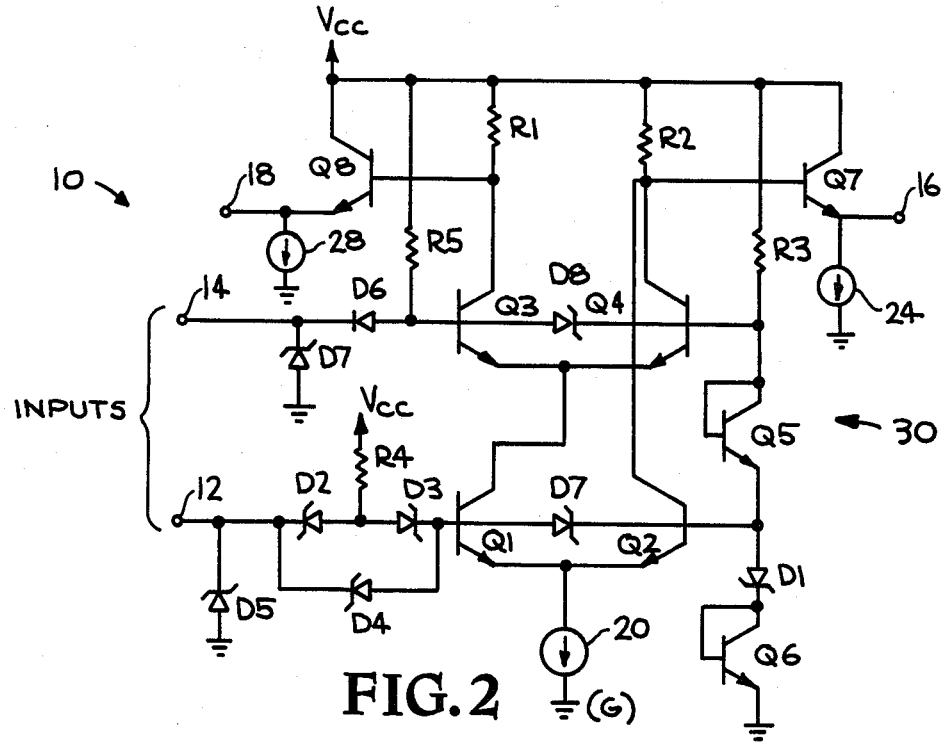
FIG. 2 is a detailed schematic diagram of the circuit of this invention.

Referring now to FIG. 2, the circuit elements that form the translation circuit 10 is illustrated. At the heart of the circuit are two emitter-coupled transistor pairs Q1/Q2 and Q3/Q4. The emitter terminals of each transistor pair are connected together, and the transistor pair Q1/Q2 are connected to a current source 20, which in turn is connected to ground (G) potential. The emitter terminals of the transistor pair Q3/Q4 are connected to the collector terminal of transistor Q1, and the collector terminals of the transistors Q3 and Q4 are respectively coupled by resistors R1 and R2 to a supply voltage $V_{CC}$. The collector terminal of transistor Q2 connects to the collector terminal of transistor Q4.

The transistors Q2 and Q4 of each of the transistor pairs Q1/Q2 and Q3/Q4 form the reference transistors against which input signals are compared. The base terminals of the transistors Q2 and Q4 are coupled to a bias driver network formed from a series connection between the supply voltage $V_{CC}$ and ground potential by resistor R3, of transistor Q5, diode D1 and transistor Q6. The transistors Q5 and Q6 are connected in a diode configuration by coupling the base terminal of each to their respective collector terminals. The diode D1 is a Schottky diode, used for its lower forward bias voltage drop (which is approximately 500 mv, as compared to the forward bias voltage drop ($V_{BE}$) of a transistor of approximately 800 mv). The resistor R3 couples the base terminal of transistor Q4 and the connected base and collector terminals of transistor Q5 to the supply voltage $V_{CC}$, and the base terminal of the transistor Q2 is coupled to the emitter terminal of transistor Q5 and to the anode of the diode D1. The cathode of the diode D1 is connected to the connected base and collector terminals of the transistor Q6, the emitter terminal of which is connected to ground potential.

The transistors Q1 and Q3 of each transistor pair, which form the input transistors for the circuit, have their respective base terminals coupled to the input terminals 12 and 14 for receiving the TTL signals applied thereto. The base terminal of the transistor Q1 is coupled to the input terminal 12 by a pair of Schottky diodes D2 and D3. The cathode of the diode D3 connects to the base terminal of transistor Q1, while its anode connects to the anode of diode D2. In turn, the cathode of diode D2 connects to the input terminal 12. A resistor R4 is coupled between the connected anodes of diodes D2 and D3 and the supply voltage $V_{CC}$. A diode D4 is connected in parallel with the diodes D2 and D3. The anode of diode D4 is connected to the base terminal of transistor Q1, and its cathode is connected to the input terminal 12. The function of the diode D2 is to isolate the base of the transistor Q1 from high voltages, to keep the transistor from saturating. Diode D3 compensates for the voltage drop caused by diode D2, and diode D4 functions to provide a DC current path from the base terminal of transistor Q1 to the input terminal 12 when the input voltage transistion goes from a HIGH state to a LOW state.

The input terminal 12 is provided with a clamping diode D5 that is coupled between the terminal and ground potential. The diode D5 (a Schottky diode) conducts when an input signal goes negative, limiting undershoot and helping to control ringing of long signal lines following a HIGH-to-LOW transition.

Similarly, input terminal 14 is coupled to a cathode of a diode D6 and to a cathode of a clamping diode D7 (the latter diode, a Schottky diode) functioning in the same manner as diode D5: To suppress transient currents. The anode of diode D6 is connected to the base terminal of Q3.

The transistor Q3 is biased by the resistor R5 which is coupled between the base terminal of the transistor Q3 and the supply voltage $V_{CC}$.

The AND and NAND outputs of the translation circuit 10 appear at the collector terminals of the transistors Q3 and Q4, and are coupled to the output terminals 16 and 18 by emitter-follower circuits that include transistors Q7 and Q8. The transistor Q7 has a base terminal connected to the collector terminals of transistors Q2 and Q4, an emitter terminal coupled to a current source 24 and to the output terminal 16. In similar fashion a transistor Q8 has a base terminal connected to the collector terminal of transistor Q3, and an emitter terminal connected to a current source 28 and to the output terminal 18.

Diodes D9 and D8, both Schottky diodes, respectively couple the base terminals of transistors Q1, Q3 to the base terminals of the transistors Q2, Q4. The diodes D9 and D8 respectively function to clamp the base terminals of the input transistors Q1, Q3 to a voltage level that minimizes the possibility of these transistors saturating when in their conducting states.

Operation of the translation circuit 10 is as follows: Assume that the TTL signals applied to the input terminals 12 and 14 are both HIGH (i.e., greater than 2.4 VDC). The HIGH at input terminal 14 causes the base terminal of transistor Q3 to be pulled toward the supply voltage $V_{CC}$. The base terminal of the other transistor Q4 is biased at approximately 2.1 VDC, a voltage less than that applied to the base terminal of Q3. The result is that transistor Q3 will be placed in a conducting state and transistor Q4 in a substantially non-conducting state. Turning to the transistor pair Q1/Q2, the HIGH at the input terminal 12 will place transistor Q1 in a conducting state and transistor Q2 in a substantially non-conducting state. With transistors Q1 and Q3 both "ON", the base terminal of transistor Q8 will be pulled toward ground, forcing the output terminal 18 to a LOW (ECL compatible) voltage level. Conversely, the base terminal of transistor Q7 is pulled toward $V_{CC}$ by the resistor R2 (and the lack of current conduction through transistors Q2 and Q4), applying a HIGH (ECL compatible) level to the output terminal 16.

Assume now that the TTL signal applied to the input terminal 12 is a logic LOW (i.e., approximately ground potential). The diode D4 will conduct to pull the base terminal of the transistor Q1 to a voltage that is less than the reference voltage applied to the base terminal of transistor Q2 by the bias driver network 30. Accordingly, transistor Q1 is placed in a substantially non-conducting state, terminating the current path for the transistor Q3, and thereby placing the transistor Q3 in a substantially non-conducting state also. The transistor Q2, on the other hand, is now in a conducting state, pulling the base terminal of the transistor Q7 toward an (ECL) LOW. Thus, an ECL LOW (ECL compatible) level appears at the output terminal 16; and since transistor Q3 is no longer conducting, the base terminal of the transistor Q8 is pulled high by resistor R1.

If the TTL voltage states applied to the input terminals 12 and 14 were reversed, i.e., a TTL HIGH applied to input terminal 12, and a TTL LOW applied to the input terminal 14, the result would be the same; as it would be if TTL LOWs were applied to both input terminals 12 and 14.

Because the transistor pairs Q1/Q2 and Q3/Q4 utilize the same bias driver network, together with the intercoupling of the transistor pairs, a significant circuit reduction is achieved. This reduction is further developed by integrating the translation function with the logical AND/NAND function.

Figure 3:
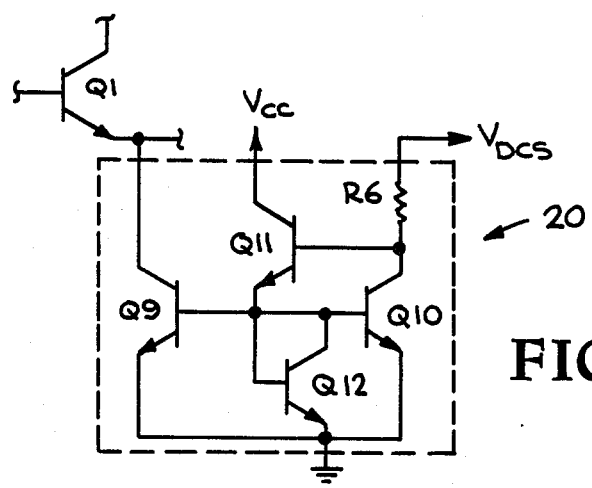
FIG. 3 is a detailed circuit diagram of a preferred form of the current source used in the circuit of FIG. 2.

A preferred form of the current source 20 uses a current mirror technique, and such a current source is illustrated in FIG. 3, designated generally by the reference numeral 20'. As shown, the current source 20' includes a current transistor Q10, a current mirror transistor Q9, and a bias network comprising transistors Q11 and Q12. The current mirror transistor Q9 has a collector terminal that is coupled to the emitter of the transistor Q1 (and the transistor Q2—see FIG. 2), and an emitter terminal connected to ground potential. The base terminal of the transistor Q9 is coupled to the base terminal of the current transistor Q10. The emitter terminal of the mirror transistor Q10 is connected to ground potential, and its collector terminal is coupled to a bias voltage $V_{DCS}$ by a resistor R6. The bias voltage may be any value, as long as it is sufficient to allow effective operation of the translation circuit 10 (FIG. 2).

The transistor Q11 of the bias network for the current source has an emitter terminal coupled to the base terminal of transistor Q12 and to the connected base terminals of transistors Q9 and Q10. The collector terminal of the transistor Q11 is coupled to the supply voltage $V_{CC}$, and its base terminal is connected to the collector terminal of the transistor Q10. The transistor Q12 has its collector terminal connected to the base terminals of transistors Q9 and Q10, and its emitter terminal is connected to ground potential.

The transistors Q11 and Q12, together with the resistor R6 and bias voltage $V_{DCS}$, function to clamp the base terminal of the transistors Q9 and Q10 to a predetermined voltage, establishing a fixed current level conducted by the transistor Q10. Since the base terminals of transistors Q9 and Q10 are at the same potential, as are their emitter terminals, the current that is conducted by transistor Q10 is "mirrored" by the current conducted by transistor Q9. In addition, the collector-to-emitter voltage ($V_{CE}$) of the transistor Q9, while in the non-saturating region of conduction, is at a level sufficient to keep the transistor Q1 (FIGS. 2 and 3) from saturating.

I claim:

1. A circuit for converting the voltage levels of at least a pair of signals provided by transistor-transistor-logic (TTL) circuits to voltage levels that are compatible with emitter-coupled logic (ECL) circuitry and for performing a logic function on said signal pair, comprising:

first and second input terminals for respectively receiving the pair of TTL signals;
   a first pair of transistors having their emitter terminals coupled to a current source, a first base terminal of a first transistor of said first pair being coupled to the first input terminal for receiving one of the TTL signals; a second pair of transistors having their emitter terminals coupled to a collector terminal of the first transistor of the first pair, a base terminal of a first transistor of the second pair being coupled to the second input terminal, a collector terminal of a second transistor of the second pair being coupled to a collector terminal of the second transistor of the first pair, the collector terminals of the second transistors being further coupled to a first voltage supply terminal, the collector terminal of said first transistor of said second pair being coupled to said first voltage supply terminal;
   means for generating a first and a second reference voltage, a base terminal of the second transistor of the first pair being coupled to the generating means for receiving the first reference voltage, a base terminal of the second transistor of the second pair being coupled to the generating means for receiving the second reference voltage; an output terminal being coupled to the collector terminal of the second transistor of the second transistor pair and
   two series-connected diodes, each having their anode terminals connected to one another, coupling the first input terminal to the base terminal of the first transistor of the first pair.

2. The circuit of claim 1, including a third diode having a cathode terminal coupled to said second input terminal and an anode terminal coupled to the base terminal of the first transistor of the second pair.

3. The circuit of claim 2, including a fourth diode connected in a parallel circuit configuration with said series-connected diodes, the fourth diode having a cathode terminal coupled to the first input terminal and an anode terminal coupled to the base terminal of the first transistor of the first pair of transistors.

4. The circuit of claim 3, wherein the reference voltage generation means includes first and second diode configured transistors, each having a base terminal and a collector terminal connected to one another, and a diode having an anode terminal coupled to the emitter terminal of the first diode configured transistor and a cathode terminal connected to a collector terminal of the second diode configured transistor, the emitter terminal of the second diode configured transistor being coupled to a ground potential.

5. The circuit of claim 4, wherein the first and second-diode configured transistors and diode are connected in series between a second supply voltage terminal and the ground potential; and the base terminal of the second transistor of said second pair of transistors is coupled to the collector terminal of the first diode-configured transistor, and the base terminal of the second transistor of the first pair of transistors is coupled to the anode of the diode.

6. The circuit of claim 2, including, for each of the first and second pair of transistors, a diode having an anode coupled to the base terminal of the first transistor and a cathode coupled to the base terminal of the second transistor.

7. A TTL-to-ECL translation and AND/NAND logic circuit comprising:

at least two input terminals;
   at least two transistor pairs, each of the transistor pairs including an input transistor and an opposing transistor having emitter terminals connected together, a base terminal of each input transistor being coupled to a corresponding one of the input terminals, a collector terminal of the opposing transistor of a first transistor pair being coupled to a collector terminal of the opposing transistor of a second transistor pair, the collector terminals of the opposing transistors being further coupled to a first voltage supply terminal, the collector terminal of said first transistor of said second pair being coupled to said first voltage supply terminal, and a collector terminal of the input transistor of the first transistor pair being coupled to the emitter terminals of the second transistor pair;
   a current source coupled to the emitter terminals of the first transistor pair;
   an output terminal coupled to the collector terminal of the opposing transistor of the second transistor pair for providing thereat an output signal indicative of the logical AND of the TTL signals received at the input terminals; and
   a diode for each transistor pair, having an anode terminal coupled to the base terminal of the input transistor and a cathode terminal coupled to the base terminal of the opposing transistor.

8. The circuit of claim 7 including:

two series-connected diodes, each having anode terminals connected to one another, coupling a first input terminal to the base terminal of the input transistor of the first transistor pair; and
   a third diode having a cathode terminal coupled to a second input terminal and an anode terminal coupled to a base terminal of the input transistor of the second transistor pair.

9. The circuit of claim 8 including a fourth diode connected in parallel to said series-connected diodes, having a cathode terminal coupled to said first input terminal and an anode terminal coupled to said base terminal of the input transistor of the first transistor pair.

10. The translation circuit of claim 8 wherein the current source includes a first transistor having a collector terminal coupled to the emitter terminals of the first transistor pair, a second transistor having a base terminal coupled to a base terminal of the first transistor, and means for biasing said first and second transistors.

11. The translation circuit of claim 10, wherein the means for biasing the first and second transistors includes a third transistor having an emitter terminal coupled to an emitter terminal of the first transistor and base and collector terminals coupled to the base terminals of the first and second transistors and a fourth transistor having an emitter terminal coupled to the base terminals of the first and second transistors, a collector terminal disposed to receive a supply voltage, and a base terminal coupled to a collector terminal of the second transistor.

12. The circuit of claim 9, including a bias circuit means for providing at least two reference voltages, the opposing transistors of each of the transistor pairs having a base terminal coupled to the bias circuit means for receiving a corresponding one of the reference voltages.

13. The translation circuit of claim 12, wherein the bias circuit means includes a first transistor having base and collector terminals coupled to the base terminal of the opposing transistor of the second transistor pair and an emitter terminal coupled to a base terminal of the opposing transistor of the first pair, a second transistor having a base terminal and a collector terminal coupled together, and a diode having an anode terminal coupled to an emitter terminal of the first transistor and a cathode terminal coupled to the collector terminal of the second transistor.

14. The translation circuit of claim 13, wherein the bias circuit means includes a second voltage supply terminal coupled to receive a supply voltage and a resistor coupling the voltage supply terminal to the collector terminal of the first transistor.

15. The translation circuit of claim 13, wherein the diode is a Schottky diode.

16. The circuit of claim 2 including an output terminal coupled to the collector terminal of the second transistor of the second pair to form the output terminal of an AND gate.

17. The circuit of claim 2 including an output terminal coupled to the collector terminal of the first transistor of the second pair to form the output terminal of a NAND gate.

* * * * *